United States Patent
Kato et al.

[11] Patent Number: 5,913,978
[45] Date of Patent: Jun. 22, 1999

[54] APPARATUS AND METHOD FOR REGULATING PRESSURE IN TWO CHAMBERS

[75] Inventors: Susumu Kato; Masahito Ozawa; Sunao Muraoka, all of Yamanashi-ken, Japan

[73] Assignees: Tokyo Electron Ltd., Tokyo-to; Varian Japan K.K.T, Tokyo, both of Japan

[21] Appl. No.: 08/629,938

[22] Filed: Apr. 12, 1996

[30] Foreign Application Priority Data

Apr. 20, 1995 [JP] Japan ................................ 7-119405

[51] Int. Cl.⁶ .................................................. L23C 16/00
[52] U.S. Cl. ............... 118/719; 204/298.25; 204/298.35; 156/345; 414/217; 414/939; 251/326; 251/329
[58] Field of Search ....................... 118/719; 204/298.25, 204/298.35; 156/345; 414/217, 939; 251/326, 328, 329

[56] References Cited

U.S. PATENT DOCUMENTS

| | | | |
|---|---|---|---|
| 4,167,915 | 9/1979 | Toole et al. | 118/708 |
| 4,785,962 | 11/1988 | Toshima | 220/260 |
| 5,186,718 | 2/1993 | Tepman et al. | 29/25.01 |
| 5,277,215 | 1/1994 | Yanagawa et al. | 137/14 |
| 5,388,944 | 2/1995 | Takanabe et al. | 414/217 |
| 5,474,410 | 12/1995 | Ozawa et al. | 414/217 |

FOREIGN PATENT DOCUMENTS

| | | | |
|---|---|---|---|
| 2-267948 | 11/1990 | Japan | 414/939 |
| 3-4927 | 1/1991 | Japan | 118/719 |
| 6-5520 | 1/1994 | Japan . | |
| 6-314729 | 11/1994 | Japan | 414/939 |

Primary Examiner—R. Bruce Breneman
Assistant Examiner—Jeffrie R Lund
Attorney, Agent, or Firm—Beveridge, DeGrandi, Weilacher & Young, L.L.P.

[57] ABSTRACT

A gas is supplied to a second chamber so that the pressure in the second chamber is raised to a predetermined level. A communication passage is provided for internally connecting the first and second chambers. When the pressure in the first chamber attains the predetermined level, the gas is allowed to flow from the second chamber into the first chamber through the communication passage. A gas flow can be checked when an open-close door is opened to connect the chambers. Thus, there is no substantial gas flow, so that particles can be prevented from being flung up.

13 Claims, 6 Drawing Sheets

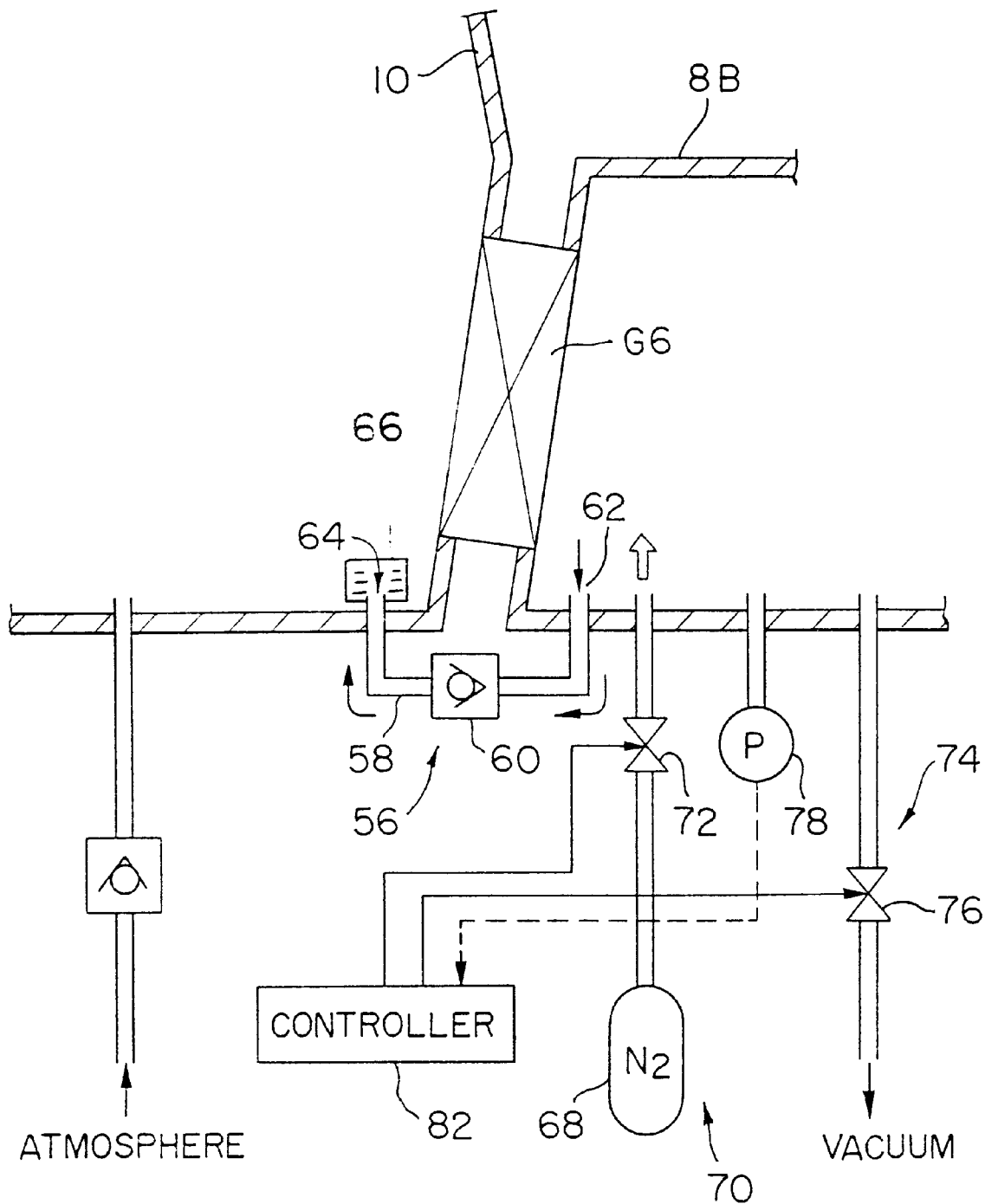
F I G. 3

APPARATUS AND METHOD FOR REGULATING PRESSURE IN TWO CHAMBERS

BACKGROUND OF THE INVENTION

1. Field of the Invention

The present invention relates to an apparatus and a method for regulating pressures in two chambers, for example, a multi-chamber semiconductor process apparatus.

2. Information of the Related Art

In general, in manufacturing semiconductor integrated circuits, semiconductor wafers are subjected to various processes, such as film deposition, etching, etc. Conventionally, this series of processes is executed in a manner such that the semiconductor wafers are takes out in a batch from one process apparatus after undergoing a specific process therein, and are transported in the atmosphere to another process apparatus for the next process. According to this method, the efficiency of operation is not very high, due to the inevitable transportation in the atmosphere after the completion of every process.

Recently, therefore, a so-called multi-chamber process apparatus has been developed in order to improve the operating efficiency of the processes. In this apparatus, a plurality of different sheeter-type process units for the aforesaid series of processes are combined together so that the semiconductor wafers having undergone one process can be delivered to another process without being exposed to the atmosphere.

In the multi-chamber semiconductor process apparatus of this type, for example, a film deposition chamber and a etching chamber are connected to a transfer chamber which is always kept in a vacuum. The transfer chamber is coupled with a small-capacity load locking chamber whose internal pressure is changed as required between the levels of a vacuum pressure and the atmospheric pressure. Thus, the wafers can be delivered between the transfer chamber and the load locking chamber without breaking the vacuum in the transfer chamber.

In order to prevent natural oxidation of the wafer surface, moreover, the load locking chamber is loaded with an inert gas, e.g., nitrogen gas, and is coupled with a loader chamber which is always kept substantially at the atmospheric pressure. Thus, the wafers introduced into the apparatus can be delivered between the load locking chamber and the loader chamber.

In a manufacturing process for semiconductor wafers, workpieces are subjected to micron-order machining, so that the existence of a very small quantity of dust or particles may easily result in defective products. How to remove these particles is an essential problem.

In these circumstances, a gas or air inevitably flows into one of the two connected chambers due to the difference in pressure between the chambers as the semiconductor wafers are delivered between them. In some cases, therefore, particles are flung up and caused to adhere to the wafers. In internally connecting the load locking chamber, whose internal pressure is repeatedly changed between the levels of the vacuum and atmospheric pressures, and the loader chamber which is always kept substantially at the atmospheric pressure, in particular, the two chambers are tentatively subjected to a pressure difference in advance so that they can be caused to communicate with each other by opening a gate valve between them when the internal pressure of the load locking chamber is raised substantially to the level of the atmospheric pressure by the nitrogen gas supply.

As yet, however, there is no high-accuracy pressure sensor which can cover a pressure range as high as the atmospheric pressure and can accurately measure pressure differences of a level such that no gas flows. Even when a zero differential pressure is detected by the pressure sensor, therefore, the gas may possibly flow and fling up particles with every connection of the chambers due to a pressure difference which is involved in an error in measurement.

In the modern technology which handles semiconductor devices of higher density and finer configuration, in particular, the presence of the scantiest particles may cause a reduction in yield. Thus, there is a demand for an immediate solution to this problem.

SUMMARY OF THE INVENTION

The object of the present invention is to provide an apparatus and a method for regulating pressures in two chambers, in which the difference in pressure between the chambers is reduced to nearly zero when the chambers are caused to communicate with each other, whereby a gas flow between the chambers can be minimized to prevent particles from being flung up.

In order to achieve the above object, according to the present invention, there is provided an apparatus for regulating pressures in first and second chambers which can communicate with each other through an open-close door, whereby the difference in pressure between the chambers is adjusted to approximately zero when the pressure in the second chamber is higher than the pressure in the first chamber, the apparatus comprising: gas supply means for supplying a gas to the second chamber, thereby raising the pressure in the second chamber to a predetermined selected level; communication means for internally connecting the first and second chambers; and release means for allowing the gas to flow from the second chamber into the first chamber through the communication means when the predetermined level is attained by the pressure in the second chamber.

In opening the open-close door to cause the first and second chambers to communicate with each other, the gas is introduced into the second chamber so that the pressure in the second chamber is substantially on the predetermined selected level (substantially equal to or higher than the level of the internal ambience pressure of the first chamber). When the pressure in the second chamber becomes a little higher than the internal pressure of the first chamber, in this case, the release means (e.g., relief valve) in the communication means is actuated to let the pressure in the second chamber go to the first chamber, whereupon the respective internal pressures of the two chambers can be securely kept on the same level.

More specifically, the final pressure difference between the two chambers depends on the working differential pressure of the relief valve as the release means, so that the working differential pressure should be as low as possible.

Preferably, moreover, the open-close door should not be opened immediately after the gas supply to the second chamber is stopped, but be kept on standby for a predetermined period of time before the relief valve is fully actuated to equilibrate the pressure.

The first chamber may be a loader chamber of a process apparatus for treating to-be-treated objects such as semiconductor wafers, and the second chamber may be a load locking chamber which can communicate with the loader chamber.

Since the communication means, having the relief valve therein, is formed between the two chambers, as described above, the pressure difference between the chambers can be reduced to a very small value, so that a gas flow can be checked when the open-close door is opened to connect the chambers. Thus, there is no substantial gas flow, so that particles can be prevented from being flung up.

By applying the pressure regulating apparatus with this construction to an object process apparatus, such as a semiconductor manufacturing apparatus, raised particles can be reduced, so that the yield of products can be improved.

BRIEF DESCRIPTION OF THE DRAWINGS

FIG. 3 is a diagram showing the pressure regulating apparatus according to the embodiment of the invention;

FIGS. 4A and 4B are graphs illustrating pressure fluctuations, in which FIG. 4A shows a case for a prior art apparatus, and FIG. 4B shows a case for the apparatus of the invention;

DETAILED DESCRIPTION OF THE PREFERRED EMBODIMENTS

A pressure regulating apparatus and a chamber connecting method using the same, according to one embodiment of the present invention, will now be described in detail with reference to the accompanying drawings.

Figure 1:
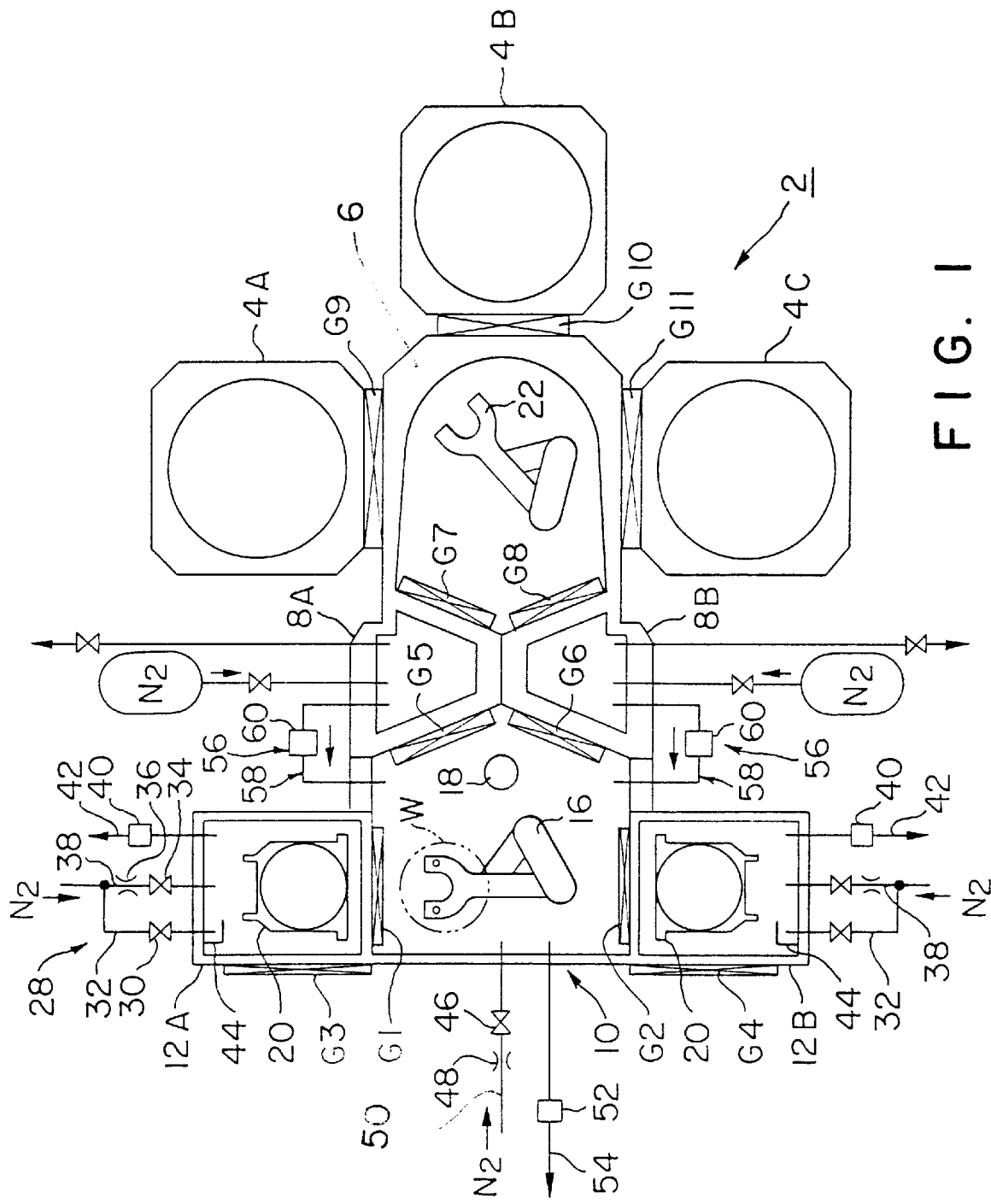
FIG. 1 is a schematic plan view showing a multi-chamber process apparatus incorporating a pressure regulating apparatus according to an embodiment of the present invention.
Figure 2:
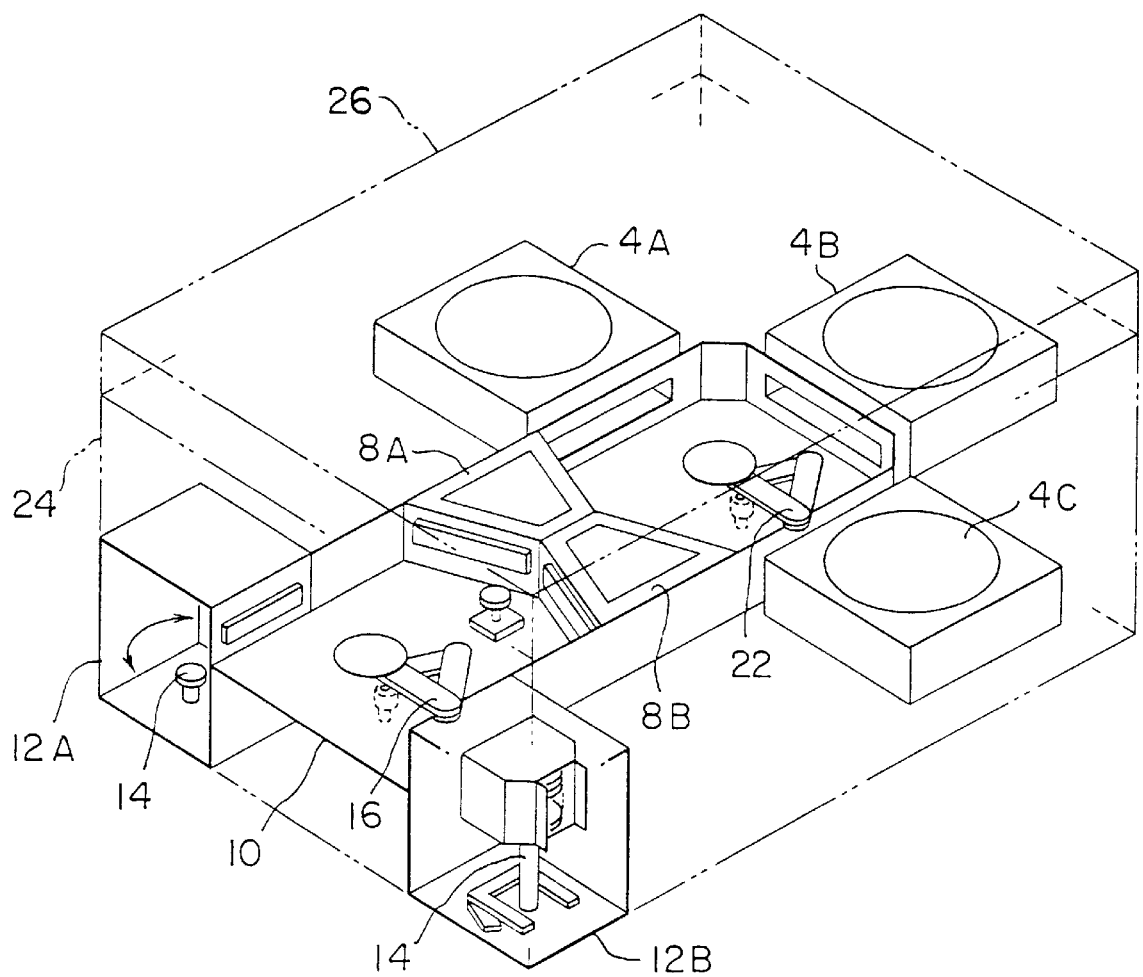
FIG. 2 is a schematic perspective view of the process apparatus shown in FIG. 1.

Referring first to FIGS. 1 and 2, a multi-chamber process apparatus will be explained before describing the apparatus of the invention.

In the multi-chamber process apparatus 2, first, second, and third vacuum process chambers 4A, 4B and 4C are connected to a common transfer chamber 6, and first and second load locking chambers, adjoining each other, are connected in common to the transfer chamber 6. Also, a loader chamber 10 is located adjacent to the load locking chambers 8A and 8B, and first and second cassette chambers 12A and 12B are attached to the loader chamber 10, thus forming a multi-chamber unit (cluster tool).

The vacuum process chambers 4A, 4B and 4C constitute a cluster of chambers which is used in successively treating the surface of a semiconductor wafer as a to-be-treated object. In the first vacuum process chamber 4A, a tungsten layer is formed on a fine pattern, for example, by CVD. In the second vacuum process chamber 4B, a titanium film is formed on a wafer with a fine pattern thereon, for example, by sputtering at a temperature of 400 to 500° C. In the third vacuum process chamber 4C, the tungsten layer is etched back.

The first and second cassette chambers 12A and 12B are connected to the opposite sides of the loader chamber 10 through gate valves G1 and G2, respectively. Each of the cassette chambers 12A and 12B constitutes a wafer delivery boat for the process apparatus, and is provided with a cassette stage 14 which is both rotatable and liftable.

The loader chamber 10 and the cassette chambers 12A and 12B have independent gastight structures. The cassette chambers 12A and 12B are provided with gate doors G3 and G4, respectively, which open and close to expose to end cut off the interior of the chambers from the external ambience or the atmosphere.

Arranged in the loader chamber 10 are a first transportation arm 16, which is formed of, e.g., a multi-joint arm, and a rotating stage 18 for aligning the center and orientation flat of a semiconductor wafer W.

The loader chamber 10 is used to transfer wafers between cassettes 20 in the cassette chambers 12A and 12B and the load locking chambers 8A and 8B. The first and second load locking chambers 8A and 8B, having the same configuration, are connected to the back of the loader chamber 10 through gate valves G5 and G6, respectively. Located in each load locking chamber is heating-cooling means (not shown) for heating or cooling the wafer as required.

The transfer chamber 6 is connected to the rear side of the first and second load locking chambers 8A and 8B through gate valves G7 and G8, respectively. Located in the transfer chamber 6 is a second transportation arm 22 for transferring the wafer W between the two load locking chambers 8A and 8B and the three vacuum process chambers 4A, 4B and 4C or between the vacuum process chambers. The three process chambers 4A, 4B and 4C are connected individually to three adjacent sides of the transfer chamber 6 through gate valves G9, G10 and G11.

As shown in FIG. 2, the whole process apparatus is housed in an open-topped and -bottomed casing 24. For example, an HEPA filter 26 for purifying a descending current is provided covering the top opening entire. Thus, the whole apparatus is disposed in a so-called clean room.

The following is a description of principal charging-exhaust systems of all the chambers of the process apparatus constructed in this manner except the process chambers.

Since the first and second cassette chambers 12A and 12B are exposed inside to the atmosphere when the cassettes 20 are carried into or from the chambers, they are provided individually with gas supply systems 28 for replacing the introduced atmosphere with a large quantity of inert gas, e.g., nitrogen gas. Each gas supply system 28 includes two subsystems, a large-capacity feed passage 32 having an on-off valve 30 therein and a small-capacity feed passage 38 having an on-off valve 34 and a throttle valve 36 therein. Further, each of the cassette chambers 12A and 12B is connected with an exhaust passage 42 having therein a check valve 40, which is actuated by a predetermined differential pressure, and the passage 42 is subjected to a minor pilot pressure against the atmospheric pressure. A baffle plate 44 is provided close to a feed port of each large-capacity feed passage 32 in each cassette chamber. The plate 44 serves to disperse and decelerate the introduced nitrogen gas, thereby preventing it from flinging up particles.

The loader chamber 10, unlike the cassette chambers 12A and 12B, are never directly exposed inside to the atmosphere. Accordingly, only a small-capacity feed passage 50, having the on-off valve 46 and the throttle valve 40 therein, is provided as a nitrogen gas introduction system. On the other hand, an exhaust system is composed of an exhaust passage 54 having therein a check valve 52, which is actuated by a differential pressure a little higher than that for the check valve 40 in each cassette chamber, and the exhaust passage 54 is subjected to a minor pilot pressure against the pressure in the cassette chamber.

The following is a description of the relationship between the loader chamber 10 and the load locking chambers 8A and 8B. As mentioned before, the load locking chambers 8A and 8B are chambers through which wafers are transferred between the loader chamber 10, which is always kept substantially at the atmospheric pressure but with the minor pilot pressure, and the transfer chamber 6 which is always kept in a vacuum. When the locking chambers 8A and 8B are caused to communicate with the transfer chamber 6, the ambience therein is evacuated to establish a vacuum state. When the chambers 8A and 8B are caused to communicate with the loader chamber 10, in contrast with this, they are supplied with an inert gas, e.g., nitrogen gas, to be kept substantially at the atmospheric pressure. To attain this, a pair of pressure regulating apparatuses 56 are arranged individually between the loader chamber 10 and the two load locking chambers 8A and 8B, whereby the pressure is regulated immediately before the connection between the chambers lest particles be flung up. Immediately before the load locking chambers 8A and 8B are caused to communicate with the transfer chamber 6, all these chambers are in a vacuum, so that there is only a very small difference, if any, between their internal pressures, and therefore, the particles cannot be flung up. This is the reason why no pressure regulating apparatuses are arranged between the transfer chamber 6 and the load locking chambers 8A and 8B.

Referring now to FIG. 3, the pressure regulating apparatus according to the present embodiment will be described in detail.

Since the two pressure regulating apparatuses 56 have the same construction, the load locking chamber 8B will be described by way of example. First and second chambers according to claim 1 correspond to the loader chamber 10 and the second load locking chamber 8B, and an open-close door which can connect and disconnect the first and second chambers corresponds to the gate valve G6.

The pressure regulating apparatus 56 is composed mainly of a pressure escape passage 58, which internally connects the loader chamber 10 and the second load locking chamber 8B, and a relief valve 60, which is inserted in the passage 58 and opens so as to allow the gas to flow from the second load locking chamber 8B into the loader chamber 10 with a very small difference in pressure.

For example, a stainless-steel pipe with an inside diameter of ¼ inch may be used for the pressure escape passage 58. A gas outlet 62 and a gas inlet 64 of the passage 58, which are connected to the second load locking chamber 8B and the loader chamber 10, respectively, are both situated close to the gate valve G6. Thus, the difference in pressure between spaces on either side of the gate valve G6, immediately before the valve G6 is opened, can be set at a minimum value.

Preferably, the relief valve 60 is designed so that it can be opened by a minimum pressure difference, e.g., about 0.023 kg/cm² (⅓ PSI).

The second load locking chamber 8B is coupled with a gas supply system 70 which is connected to a gas source 68 for nitrogen gas or the like. A flow control valve 72 is inserted in the supply system 70. Further, the chamber 8B is coupled with an exhaust system 74 which, having an on-off valve 76 therein, is connected to a vacuum pump (not shown) in order to discharge the ambience from the locking chamber 8B. The loader chamber 10 is exposed to the atmosphere.

Moreover, the second load locking chamber 8B is provided with a pressure sensor 78, which detects the internal pressure of the chamber 8B. In opening the gate valve G6, the gas changing and exhaust are controlled in response to commands from a controller 82 which is formed of, e.g., a microcomputer.

The following is a description of the operation of the present embodiment constructed in this manner.

First, a general flow of processes for semiconductor wafers W will be described.

The cassette 20 which contains, e.g., 25 wafers W is set on the cassette stage 14 (see FIG. 2) in one of the two cassette chambers 12A and 12B, e.g., the first cassette chamber 12A, the gate door G3 is then closed, and a large quantity of nitrogen gas is fed into the cassette chamber 12A through the large-capacity feed passage 32, whereupon the ambience in the chamber 12A is replaced with the inert gas.

Then, the gate valve G1, which divides the first cassette chamber 12A from the loader chamber 10, is opened so that the loader chamber 10, which is previously subjected to a pilot pressure by the inert gas ambience, as compared with the pressure in the cassette chamber 12A, communicates with the chamber 12A. Each wafer is delivered from the cassette 20 into the loader chamber 10 and set on the rotating stage 18 by means of the first transportation arm 16 in the chamber 10, and its orientation flat and center are aligned in position.

After the position alignment, the gate valve G6 between the loader chamber 10 and the second load locking chamber 8B, out of the two load locking chambers 8A and 8B which are previously loaded with the inert gas ambience under the atmospheric pressure, is opened, and the wafer W is carried into the locking chamber 8B. After the gate valve G6 is closed, the exhaust system 74 is driven to evacuate the second load locking chamber 8B to the level of, e.g., $10^{-3}$ to $10^{-6}$ Torr, and at the same time, the wafer W is preheated to about 500° C. Subsequently, another wafer, untreated, is carried into the first load locking chamber 8A and preheated therein.

After the preheating, the gate valve G8 between the second load locking chamber 8B and the transfer chamber 6 is opened so that chamber 8B is caused to communicate with the chamber 6 which is previously decompressed to a degree of vacuum of about $10^{-7}$ to $10^{-8}$ Torr. Then, the preheated wafer W is delivered into the transfer chamber 6 by means of the second transportation arm 22 therein, and is carried into one of the vacuum process chambers which is previously decompressed for a desired process.

The wafer W is subjected to a film deposition process, etching process, etc. in a preprogrammed order. First, a tungsten film, for example, is formed on the wafer W in the first vacuum process chamber 4A, and is then etched back in the second vacuum process chamber 4B. Further, a titanium film, for example, is formed on the wafer W in the third vacuum process chamber 4C, whereupon the entire process is completed.

After the gate valve G8 between the transfer chamber 6 and the second load locking chamber 8B is opened, the treated wafer W is transferred to the chamber 8B which is emptied and previously evacuated. After the gate valve G8 is closed, nitrogen gas is introduced from the gas supply system 70 into the chamber 8B to raise its internal pressure substantially to the level of the atmospheric pressure, and the wafer W is cooled to a predetermined temperature. Thereafter, the gate valve G6 between the chamber 8B and the loader chamber 10 is opened so that the two chambers communicate with each other, the wafer W is transferred to the loader chamber 10 and is then carried into, for example, the second cassette chamber 12B which is used to store treated wafers.

The following is a description of a method for regulating the respective internal pressures of the loader chamber 10 and the load locking chamber 8A or 8B in order to deliver wafers W between the chambers, along with the operation of the pressure regulating apparatus according to the present invention.

In internally connecting the loader chamber 10 and the load locking chamber 8A or 8B, as mentioned before, the difference between their respective internal pressures should preferably be approximated to zero, in order to prevent particles from being flung up by a gas flow which is attributable to the pressure difference, immediately before the gate valve G5 or G6 between the chambers is opened. Conventionally, the gate valve is opened when pressure sensors provided individually in the two chambers exhibit substantially equal values immediately before the valve is opened. However, there are no sensors which can measure pressures in the vicinity of the atmospheric pressure with satisfactory accuracy. Actually, therefore, a minor pressure difference often exists despite the substantial coincidence of the sensor values. In some cases, for this reason, particles are flung up by a gas flow which is produced when the gate valve is opened.

According to the present invention, in contrast with this, the difference in pressure between the two chambers can be reduced to nearly zero so that particles are not flung up, immediately before the gate valve is opened.

The principle of this operation will now be described with reference to FIG. 3, which illustrates the relationship between the loader chamber 10 and the second load locking chamber 8B by way of example.

In general, the second load locking chamber 8B is kept in a vacuum before it is caused to communicate with the loader chamber 10. Accordingly, nitrogen gas is fed from the gas source 68, which is stored with nitrogen gas compressed to, e.g., about 1.2 atm., into the loader chamber 10 by driving the gas supply system 70. Thereupon, the loader chamber 10 is adjusted substantially to one atm., that is, atmospheric pressure. In this case, the gas supply time required before the internal ambience pressure becomes substantially equal to the atmospheric pressure is empirically known in advance, and is previously set so that the pressure in the load locking chamber 8B is equal to or higher than the pressure in the loader chamber 10.

If the controller 82 concludes by timer measurement or the like that the nitrogen gas has been supplied for the gas supply time set in this manner, the flow control valve 72 of the gas supply system 70 is closed, and the nitrogen gas supply is stopped.

Since the respective internal pressures of the load locking chamber 8B and the loader chamber 10 slightly vary depending on the weather, temperature, etc., the difference in pressure between these two chambers after the nitrogen gas supply can rarely be reduced to zero with accuracy. As mentioned before, moreover, the gas supply time is set so that the pressure in the load locking chamber 8B can be securely prevented from becoming lower than the pressure in the loader chamber 10 when the gas supply is stopped. Accordingly, the nitrogen gas supply is frequently stopped in a state such that the pressure in the load locking chamber 8B is a little higher than the internal pressure of the loader chamber 10.

Thus, if the pressure in the load locking chamber 8B is a little higher when the gas supply is stopped, the relief valve 60 in the pressure escape passage 58 opens. As a result, the ambience in the load locking chamber 8B flows into the loader chamber 10, whereupon the difference in pressure between the chambers 8B and 10 becomes approximately zero. In this case, a small pressure difference of about 0.023 kg/cm$^2$, for example, is needed to open the relief valve 60. Once the valve 60 is opened, however, it is never closed until the pressure difference becomes lower than 0.023 kg/cm$^2$, so that the pressure difference between the two chambers immediately before the opening of the gate valve can be set at a value lower than 0.023 kg/cm$^2$.

Further, the gate valve G6 is not opened immediately after the gas supply is stopped, and a certain period of time, e.g., 5 seconds or thereabout, is required before a gas flow through the pressure escape passage 58, which is produced by the pressure difference, is settled. When the predetermined time for the settlement of the gas flow is over after the suspension of the gas supply, the gate valve G6 is opened to connect the two chambers inside.

Figure 5:
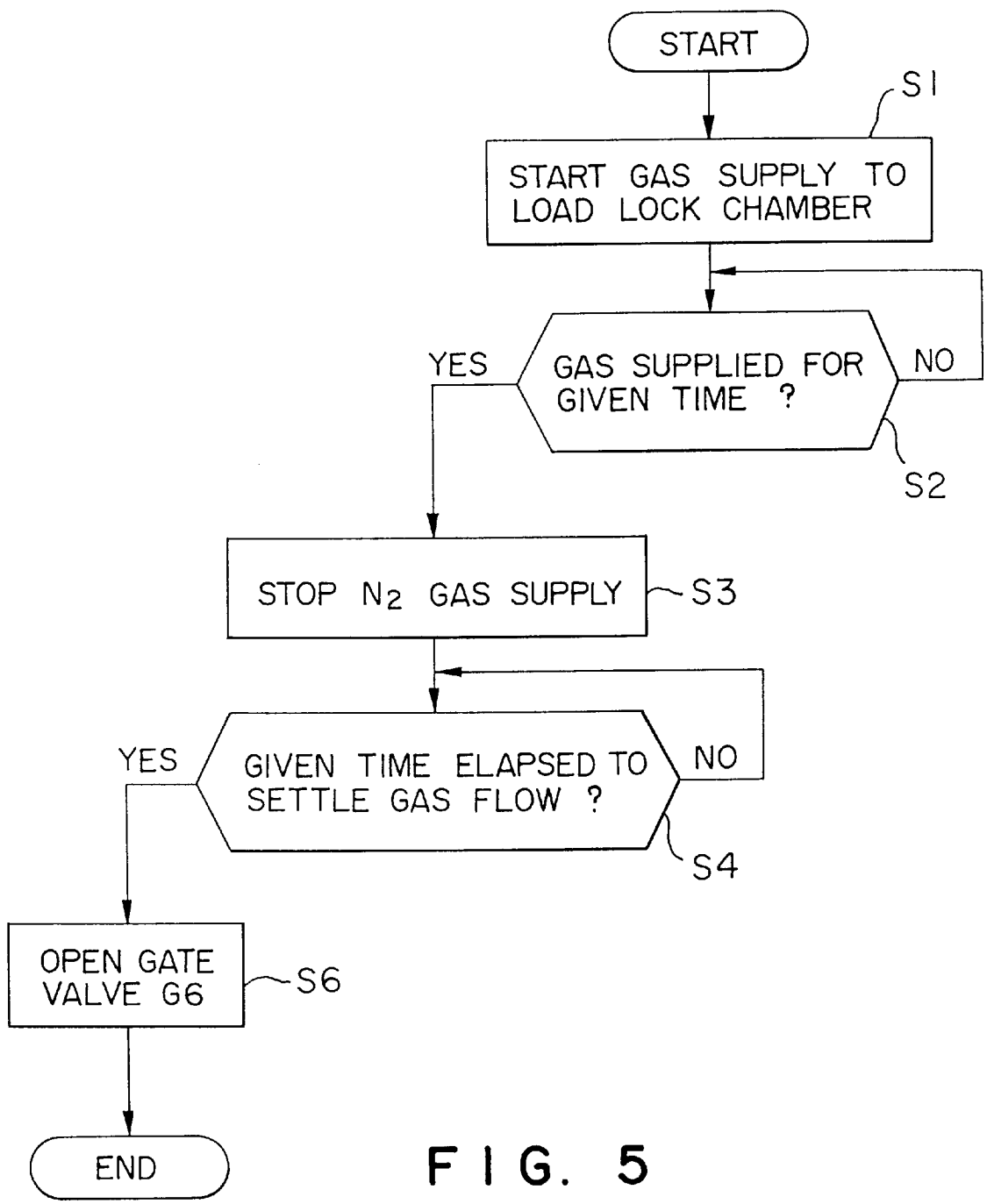
FIG. 5 is a flowchart for illustrating a method according to the embodiment of the invention.

FIG. 5 is a flowchart showing this series of processes.

Before connecting the loader chamber 10 and the second load locking chamber 8B, the nitrogen gas supply to the chamber 8B is started (S1). The gas is supplied for a predetermined time long enough to make the internal pressure of the chamber 8B equal to or a little higher than the pressure in the loader chamber 10. When the predetermined time is over (S2), the gas supply is stopped (S3).

If the internal pressure of the second load locking chamber 8B is higher than the pressure in the loader chamber 10, in this case, the relief valve 60 in the pressure escape passage 58 opens in the aforesaid manner, so that the gas flows into the loader chamber 10, whereupon the pressures in the chambers are regulated. When the predetermined time after the suspension of the nitrogen gas supply elapses so that the gas flow is settled with the pressure difference reduced substantially to zero (S4), the gate valve G6 is opened to connect the two chambers inside (S5).

Thus, the difference in pressure between the two chambers can be approximated to zero immediately before the chambers communicate with each other, so that hardly any gas flow is produced when the gate valve G6 is opened to connect the chambers. Accordingly, particles can be prevented from being flung up.

By situating the gas outlet 62 and the gas inlet 64 of the pressure escape passage 58 close to the gate valve G6 on either side thereof, moreover, the time required for the diffusion of the gas can be shortened, and correspondingly, the difference in pressure between the spaces on either side of the gate valve G6 can be reduced with speed.

Since the gas inlet 64 in the loader chamber 10 is provided with a filter portion 66, furthermore, particles, if any, produced in the introduced gas by the relief valve 60 can be removed, so that the yield of semiconductor products can be prevented from being lowered.

Immediately before the gate valve is opened, moreover, the pressure in the load locking chamber 8B may be securely prevented from becoming lower than the pressure in the loader chamber 10 by detecting the pressure of the pressure sensor 78 by means of the controller 82 and opening the gate valve on condition that the value of the sensor 78 in the locking chamber 8B should be higher than the atmospheric pressure by a margin greater than the maximum error of the sensor itself, as well as by supplying the nitrogen gas for the aforesaid predetermined time.

Fluctuations in pressure in a connected state will now be described with reference to specific examples of numerical values for the cases of the apparatus of the present invention, which is provided with the pressure escape passage, and a conventional apparatus.

Figures 4A, 4B:
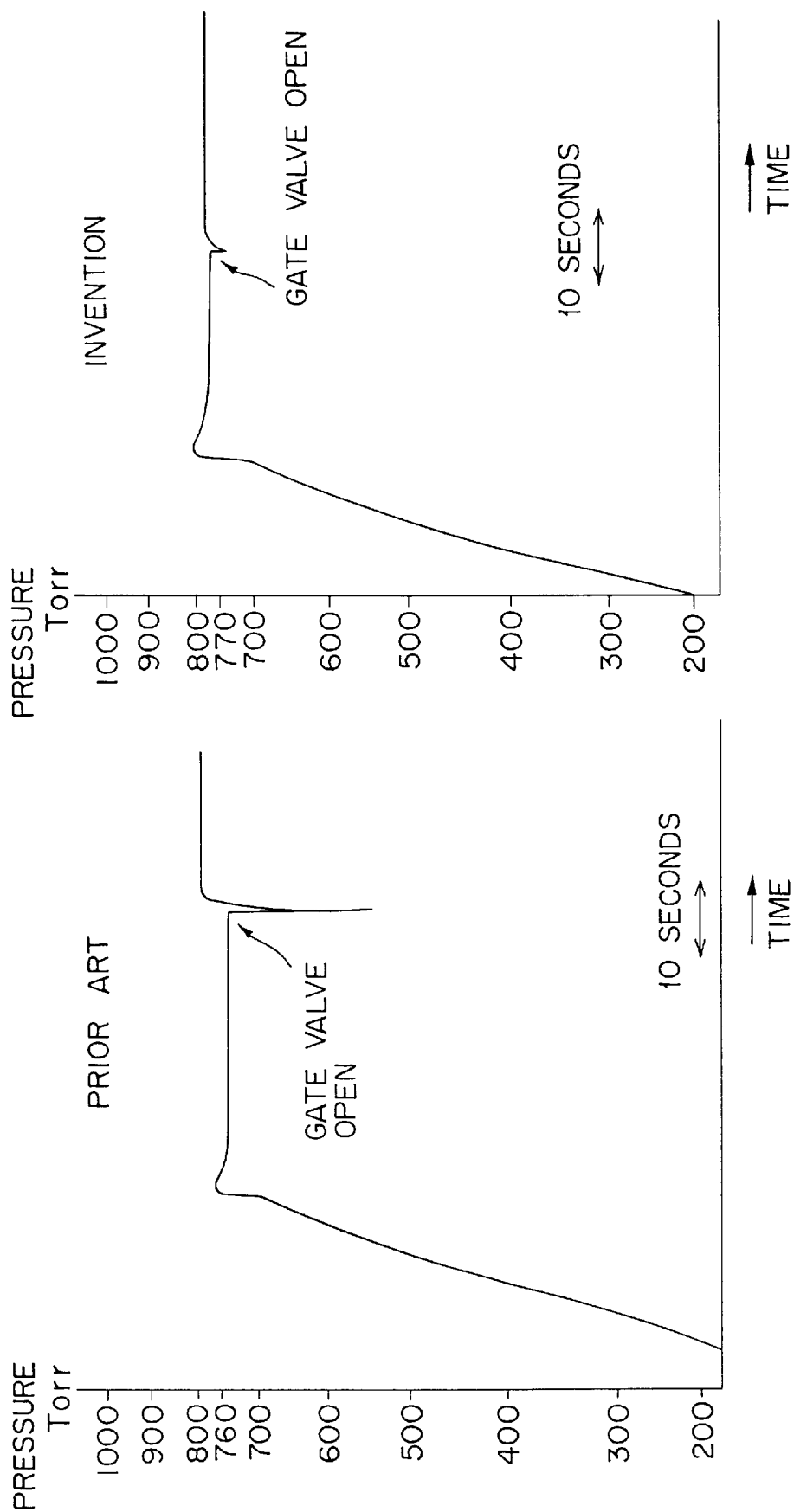

FIG. 4A shows the pressure in the load locking chamber of the conventional apparatus which is not provided with any pressure escape passage, and FIG. 4B shows the pressure in the load locking chamber of the apparatus of the invention which is provided with the pressure escape passage.

In the case of the conventional apparatus, as shown in FIG. 4A, the pressure difference caused a substantial pressure fluctuation the moment the gate valve was opened, and tens of particles were flung up. In the case of the apparatus of the invention shown in FIG. 4B, in contrast with this, the pressure difference was so small that the pressure fluctuation with the gate valve open was very small, and several particles were flung up.

The loader chamber 10 and the cassette chambers 12A and 12B are continually supplied with an inert gas, such as nitrogen gas, at a flow rate of, e.g., several liters per minute through the small-capacity feed passages 50 and 38, respectively, so that the loader chamber 10 is subjected to a minor pilot pressure against the pressures in the cassette chambers 12A and 12B. Thus, the particles in the cassette chambers 12A and 12B are prevented from getting into the loader chamber 10 when the gate valve G1 or G2 is opened so that the chambers communicate with each other.

A large quantity of nitrogen gas is fed into the cassette chamber 12A or 12B from its corresponding large-capacity feed passage 32 at a rate of, e.g., about 10 liters per minute, in order to replace air which is introduced into the chamber 12A or 12B as the cassette 20 is carried into or from the chamber. Since the baffle plate 44 at the feed port of each feed passage checks a dash of the gas flow, particles can be prevented from being flung up in each cassette chamber.

Figure 6:
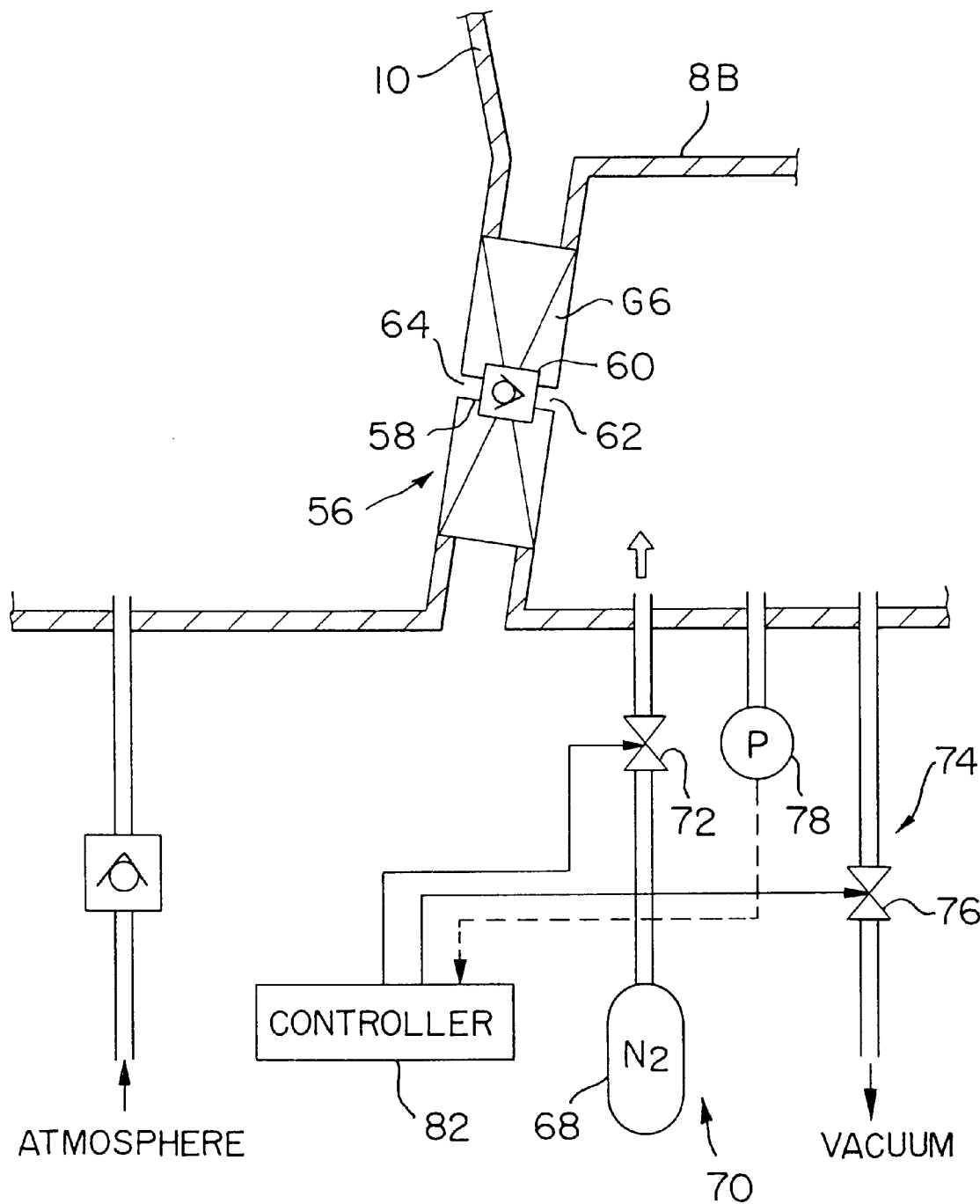
FIG. 6 is a diagram showing a modification of the pressure regulating apparatus according to the invention.

FIG. 6 shows a modification of the pressure regulating apparatus. According to this modification, the pressure regulating apparatus 56 is located in the gate valve G6. More specifically, the pressure escape passage 58 penetrates the gate valve G6 so that the loader chamber 10 and the second load locking chamber 8B communicate with each other by means of the passage. The relief valve 60 is inserted in the escape passage 58. The apparatus of this modification operates in the same manner and produces the same effect as the apparatus according to the foregoing embodiment.

Although the apparatus of the present invention is applied to the so-called multi-chamber process apparatus, according to the embodiment described above, it is to be understood that the invention is not limited to this embodiment, and may be applied to any other cases in which chambers subject to differences in pressure are internally connected.

Although the semiconductor wafers are used as objects to be treated in the apparatus described above, it is to be understood that the invention may be also applied to the case of LCD substrate process, for example.

As described herein, the pressure regulating apparatus according to the present invention and the chamber connecting method using the same can produce the following advantageous effects.

Since the pressure escape passage, having the relief valve therein, is formed between the two chambers, the pressure difference between the chambers can be reduced to a very small value, so that a gas flow can be checked when the open-close door is opened to connect the chambers. Thus, there is no substantial gas flow, so that particles can be prevented from being flung up.

By applying the pressure regulating apparatus with this construction to an object process apparatus, such as a semiconductor manufacturing apparatus, raised particles can be reduced, so that the yield of products can be improved.

While the presently preferred embodiments of the present invention have been shown and described, it is to be understood that this disclosure is for the purpose of illustration and that various changes and modifications may be made without departing from the scope of the invention as set forth in the appended claims.

What is claimed is:

1. An apparatus for regulating pressures in first and second chambers which can communicate with each other through an open-close door, whereby the difference in pressure between the chambers is adjusted to approximately zero when the pressure in the second chamber is higher than the pressure in the first chamber, comprising:

gas supply means for supplying a gas to the second chamber, thereby raising the pressure in the second chamber to a selected level;

communication means for internally connecting the first and second chambers; and release means for allowing the gas to flow from the second chamber into the first chamber through the communication means when the selected level is attained by the pressure in the second chamber, wherein said communication means includes a pipe located in the open-close door between the first and second chambers and internally connecting the chambers.

2. The pressure regulating apparatus according to claim 1, wherein said release means includes a relief valve inserted in the pipe connecting the chambers and adapted to allow the gas to flow from the second chamber into the first chamber through the pipe when the selected level is attained by the pressure in the second chamber.

3. The pressure regulating apparatus according to claim 1, wherein the pressure in said second chamber is changed as required between the levels of a pressure substantially equivalent to the atmospheric pressure and a vacuum pressure, and said first chamber is always kept substantially at the atmospheric pressure.

4. The pressure regulating apparatus according to claim 1, wherein said first and second chambers are a loader chamber and a load locking chamber, respectively, of an object process apparatus.

5. A method for regulating pressures in first and second chambers which can communicate with each other through an open-close door, whereby the difference in pressure between the chambers is adjusted to approximately zero when the pressure in the second chamber is higher than the pressure in the first chamber, comprising the steps of:

supplying a gas to the second chamber, thereby raising the pressure in the second chamber to a selected level; and allowing the gas to flow from the second chamber into the first chamber through communication means when the selected level is attained by the pressure in the second chamber, wherein said gas is allowed to flow from the second chamber into the first chamber through a pipe located in the open-close door between the first and second chambers.

6. The pressure regulating method according to claim 5, wherein said gas is allowed to flow in a stand-by time after the attainment of the selected level by the pressure in the second chamber in said process for allowing the gas to flow from the second chamber into the first chamber.

7. The pressure regulating method according to claim 5, wherein said gas is allowed to flow from the second chamber into the first chamber by a relief valve inserted in the pipe connecting the chambers.

8. The pressure regulating method according to claim 5, wherein the pressure in said second chamber is changed as required between the levels of a pressure substantially equivalent to the atmospheric pressure and a vacuum pressure, and said first chamber is always kept substantially at the atmospheric pressure.

9. The pressure regulating method according to claim 5, wherein said first and second chambers are a loader chamber and a load locking chamber, respectively, of an object process apparatus.

10. A multi-chamber process apparatus comprising:

means defining first and second chambers, an open-close door through which said chambers can communicate with each other, and means for regulating pressures in said first and second chambers whereby the difference in pressure between said chambers is adjusted to approximately zero when the pressure in the second chamber is higher than the pressure in the first chamber, said means for regulating pressures including:

gas supply means for supplying a gas to said second chamber, thereby raising the pressure in said second chamber to a selected level;

communication means for internally connecting said first and second chambers; and release means for allowing the gas to flow from said second chamber into said first chamber through said communication means when said selected level is attained by the pressure in said second chamber, wherein said communication means includes a pipe located in said open-close door between said first and second chambers and internally connecting said chambers.

11. The multi-chamber process apparatus according to claim 10, wherein said release means includes a relief valve inserted in said pipe connecting said chambers and adapted to allow the gas to flow from said second chamber into said first chamber through said pipe when said selected level is attained by the pressure in said second chamber.

12. The multi-chamber process apparatus according to claim 10, wherein the pressure in said second chamber is changed as required between the levels of a pressure substantially equivalent to atmospheric pressure and vacuum pressure, and said first chamber is always kept substantially at atmospheric pressure.

13. The multi-chamber process apparatus according to claim 10, wherein said first and second chambers are a loader chamber and a load locking chamber, respectively.

* * * * *